(12) United States Patent
Hedstrom

(10) Patent No.: US 9,402,326 B2
(45) Date of Patent: Jul. 26, 2016

(54) FIXED RELOCATABLE WIRELESS DEVICE

(71) Applicant: BrightSky, LLC, Naples, FL (US)

(72) Inventor: Mark D. Hedstrom, Naples, FL (US)

(73) Assignee: Brightsky, LLC, Naples, FL (US)

( * ) Notice: Subject to any disclaimer, the term of this patent is extended or adjusted under 35 U.S.C. 154(b) by 52 days.

(21) Appl. No.: 14/215,707

(22) Filed: Mar. 17, 2014

(65) Prior Publication Data

US 2014/0269488 A1    Sep. 18, 2014

Related U.S. Application Data

(60) Provisional application No. 61/794,516, filed on Mar. 15, 2013.

(51) Int. Cl.

| H05K 7/00 | (2006.01) |
|---|---|
| H04B 3/54 | (2006.01) |
| H01R 31/06 | (2006.01) |
| H01R 27/02 | (2006.01) |
| H04B 1/3888 | (2015.01) |
| H04M 11/06 | (2006.01) |
| H04B 1/3805 | (2015.01) |

(52) U.S. Cl.
CPC ............... *H05K 7/005* (2013.01); *H01R 27/02* (2013.01); *H01R 31/065* (2013.01); *H04B 1/3888* (2013.01); *H04B 3/54* (2013.01); *H04M 11/06* (2013.01); *H04B 1/3805* (2013.01); *H04B 2203/5441* (2013.01); *H04B 2203/5454* (2013.01); *H04M 2250/02* (2013.01); *H04M 2250/06* (2013.01)

(58) Field of Classification Search
None
See application file for complete search history.

(56) References Cited

U.S. PATENT DOCUMENTS

| 5,419,716 A | 5/1995 | Sciammarella et al. |
|---|---|---|
| 5,479,480 A | 12/1995 | Scott |

(Continued)

FOREIGN PATENT DOCUMENTS

| EP | 0863648 A3 | 9/1998 |
|---|---|---|
| WO | WO98/47300 | 10/1998 |

(Continued)

OTHER PUBLICATIONS

International Search Report & Written Opinion dated Jul. 30, 2014 received for PCT Application No. PCT/US2014/030205.

(Continued)

*Primary Examiner* — Benjamin H Elliott, IV
(74) *Attorney, Agent, or Firm* — Jon A. Gibbons; Fleit Gibbons Gutman Bongini & Bianco PL

(57) ABSTRACT

A fixed relocatable wireless device (FRWD) (100) includes a self-contained communications system for providing full-time connectivity to the Internet and/or to Internet protocol (IP) addresses via a built-in wired and/or wireless interface. Once configured, the FRWD allows an external local device access to the Internet without drivers or additional software in the local device, and without an external computer. The FRWD includes an operating system and application software. The FRWD utilizes a cellular modem (830) as backhaul for connectivity to the Internet. The FRWD allows a voice call to be originated and/or terminated over cellular voice channels. The FRWD includes circuitry (800) and antennas (802 and 804) that are completely enclosed in a housing (110) shaped as an AC wall adapter.

20 Claims, 9 Drawing Sheets

(56) References Cited

U.S. PATENT DOCUMENTS

| | | | |
|---|---|---|---|
| 5,805,416 | A | 9/1998 | Friend et al. |
| 6,241,550 | B1 | 6/2001 | Laity et al. |
| 6,252,883 | B1 | 6/2001 | Schweickart et al. |
| 6,349,199 | B1 | 2/2002 | Armantrout |
| 6,738,647 | B1 | 5/2004 | Link, II |
| 6,999,761 | B2 | 2/2006 | Bacon et al. |
| 8,315,628 | B2 | 11/2012 | Thermond |
| 8,503,363 | B2 | 8/2013 | Fulknier et al. |
| 2001/0027121 | A1 | 10/2001 | Boesen |
| 2002/0146014 | A1 | 10/2002 | Karlsson et al. |
| 2004/0164619 | A1 | 8/2004 | Parker et al. |
| 2004/0204031 | A1 | 10/2004 | Kardach et al. |
| 2005/0009560 | A1 | 1/2005 | Cavill et al. |
| 2005/0113085 | A1 | 5/2005 | Giacopelli et al. |
| 2005/0136972 | A1 | 6/2005 | Smith et al. |
| 2005/0169056 | A1 | 8/2005 | Berkman et al. |
| 2005/0181727 | A1 | 8/2005 | Russo |
| 2006/0114883 | A1 | 6/2006 | Mehta et al. |
| 2006/0212853 | A1 | 9/2006 | Sutardja |
| 2006/0219776 | A1* | 10/2006 | Finn ................... B60R 25/25 235/380 |
| 2007/0173285 | A1* | 7/2007 | Hedstrom ............ H04B 1/3805 455/553.1 |
| 2012/0082196 | A1* | 4/2012 | Hurwitz ................ G01D 4/002 375/222 |
| 2014/0269488 | A1* | 9/2014 | Hedstrom ............. H05K 7/005 370/315 |

FOREIGN PATENT DOCUMENTS

| | | |
|---|---|---|
| WO | WO00/09019 | 2/2000 |
| WO | 2008090341 | 7/2008 |
| WO | 2012122658 | 9/2012 |

OTHER PUBLICATIONS

Extended European Search Report dated Feb. 5, 2016, received for European Application No. 14763814.2.

* cited by examiner

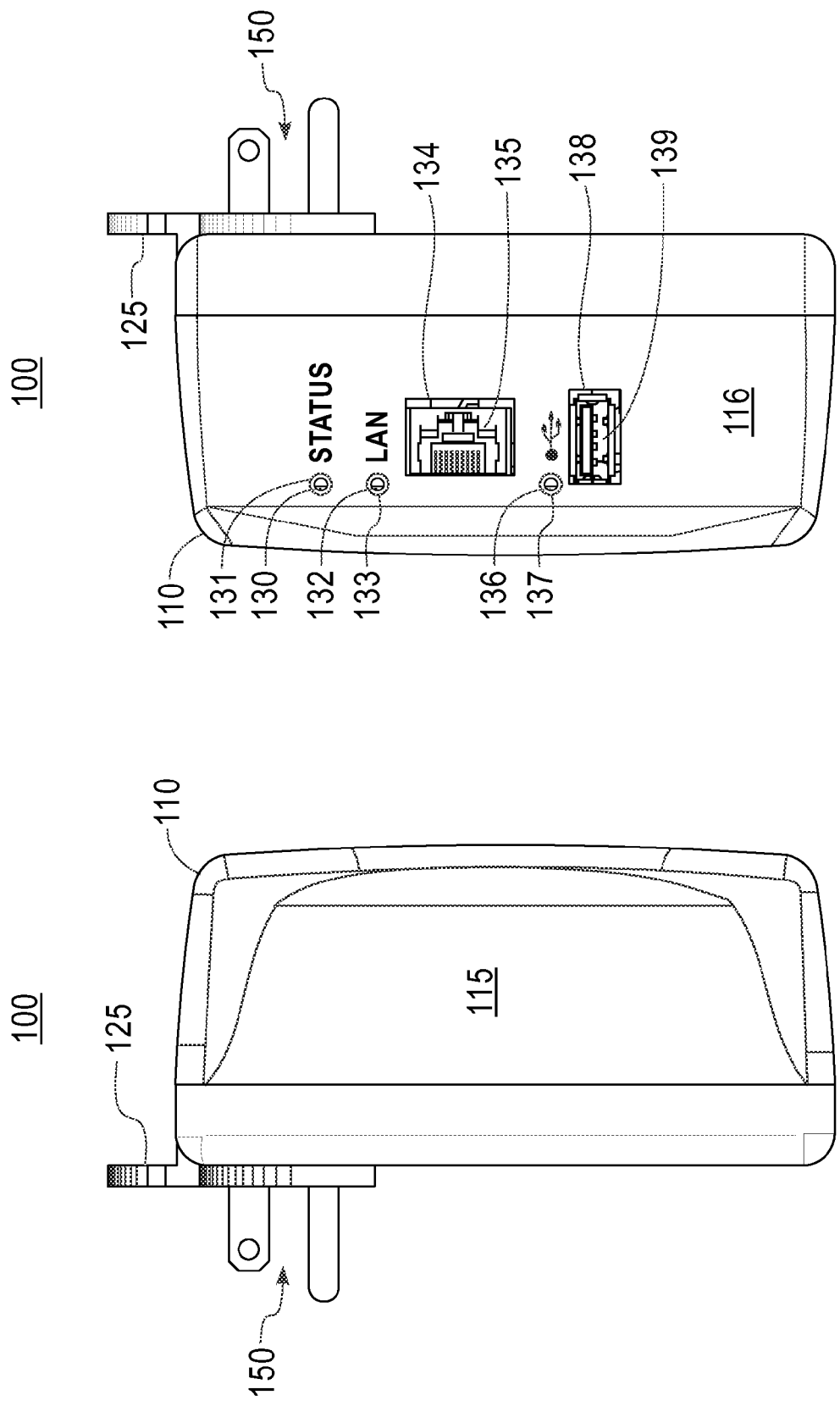

FIXED RELOCATABLE WIRELESS DEVICE

CROSS-REFERENCE TO RELATED APPLICATION

This application is based upon and claims priority to U.S. Provisional Patent Application Ser. No. 61/794,516, entitled "WIRELESS ROUTER/PLUG AND PLAY INSTANT HOT SPOT" and filed Mar. 15, 2013, the entire disclosure of which is hereby incorporated by reference herein.

BACKGROUND

1. Field

This invention relates generally to telecommunications and more particularly to an Internet protocol router with a radiotelephone having a plurality of transceivers.

2. Related Art

Mobile hotspot devices that provide Internet connectivity via a cellular connection for other devices are known. Such mobile hotspot devices communicate with such other devices via WiFi. An example of such a mobile hotspot device is a MiFi® device by Novatel Corporation. Known mobile hotspot devices lack an ability to bridge WiFi connections. Known mobile hotspot devices lack a webserver. Known mobile hotspot devices lack an ability to make "voice" calls via a cellular network using voice channels of a cellular system. A disadvantage of known mobile hotspot devices is a need to run additional software and/or drivers on an external computer. Known mobile hotspot devices do not provide local area network (LAN) Ethernet connectivity or any other type of wired connectivity for Internet Protocol (IP)-based devices. Known mobile hotspot devices lack a form factor and/or a size to allow efficient antenna size and placement. Known mobile hotspot devices require a battery to allow them to be portable; however, a disadvantage of known mobile hotspot devices in a full-time usage application is a need for continual charging of its battery.

An AC adapter is a type of external power supply enclosed in a housing that is shaped somewhat similar to a housing of an AC plug. An AC adapter includes an AC plug on one side of the housing for receiving an AC voltage (typically 120 VAC) and, on another side of the housing, an output port at which an output voltage (typically a DC voltage considerably less than the AC voltage) is available.

Routers that are compliant with both Ethernet IEEE 810.3-2005 standards and WiFi IEEE 810.11 standards are known. Some such Ethernet routers have 2.4 GHz and/or 5 GHz antenna(s) built into a housing, one or more RJ-45 Ethernet jacks on one side of the housing and a USB port on another side of the housing. Such routers disadvantageously require that one of the RJ-45 Ethernet jacks be coupled to the Internet. In addition, all such routers lack a Bluetooth transceiver and a housing that is shaped as an AC adapter.

Powerline networking devices that have a housing shaped as an AC adapter and that have an AC plug on one side of the housing and an RJ-45 Ethernet jack on another side of the housing are known. An example is the NETGEAR® Powerline AV200 Wireless-N Extender Kit. However, such known powerline networking devices lack a cellular transceiver and a Bluetooth® transceiver.

Cellular telephones that can communicate with a Bluetooth-enabled cordless telephone, so that the cordless telephone can make and receive telephone calls on a cellular system, are known. An example of such a cordless telephone is the "link-to-cell" product of Panasonic Corporation. However, the cellular telephone of such a cellular telephone-cordless telephone combination does not provide LAN Ethernet connectivity with other devices. Also, the cellular telephone of such a combination lacks a housing that is shaped as an AC adapter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6 is a left side view of one embodiment of the housing.

FIG. 7 is a right side view of one embodiment of the housing.

DETAILED DESCRIPTION

A fixed relocatable wireless device (hereinafter "FRWD") 100 comprises circuitry 800 including antennas 802 and 804 (see FIG. 8), and a housing 110. The circuitry 800 and the antennas 802 and 804 are advantageously contained entirely within the housing 110. FIGS. 1-6 show several views of one embodiment of the housing 110.

Figure 1:
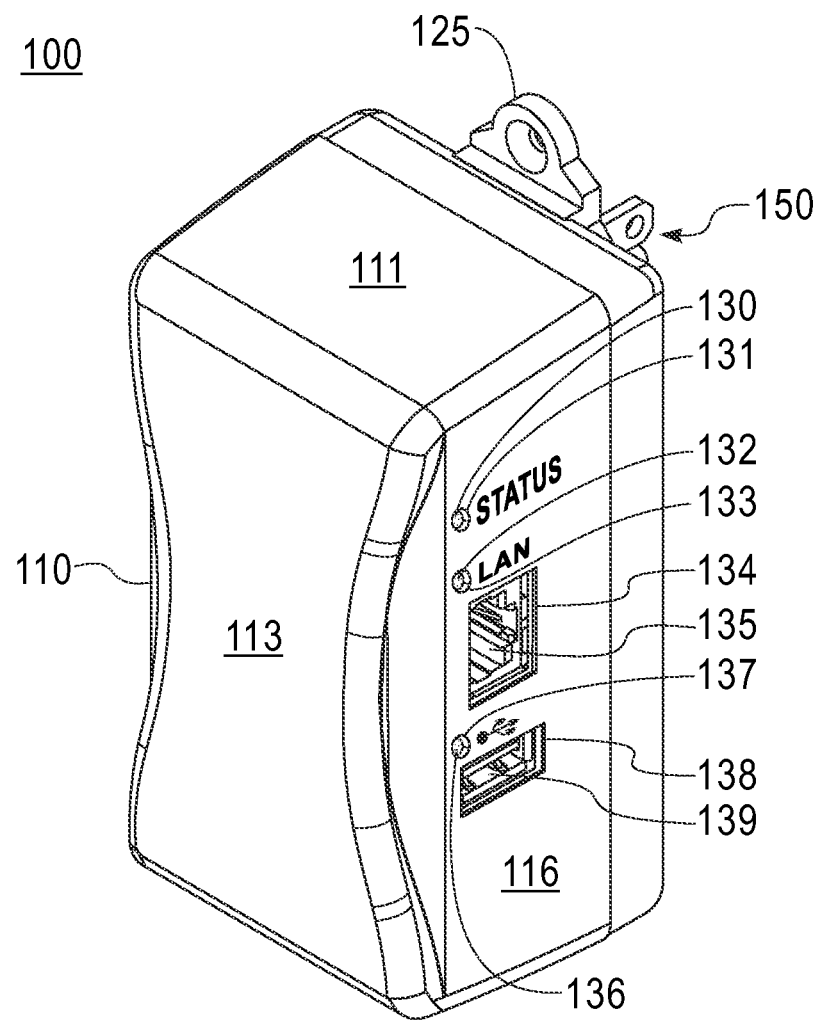
FIG. 1 is an isometric view of one embodiment of a housing of a fixed relocatable wireless device that includes circuitry and antennas.

FIG. 1 is an isometric view of the housing 110. The housing has a top side 111, a bottom side 112, a front side 113, a back side 114, a left side 115 and a right side 116. The housing 110 is shaped as an AC wall adapter. In one embodiment, the housing 110 is made of plastic. In one embodiment, the housing 110 includes a means 125 for optionally and temporarily securing the housing to another object, such as an AC wall outlet. In one embodiment, the housing 110 includes an opening 130 for a light-emitting diode 131 which can indicate status of the FRWD 100, an opening 132 for a light-emitting diode 133 which can indicate status of a LAN, an opening 134 for an Ethernet jack 135, an opening 136 for a USB light 137, and an opening 138 for a USB receptacle 139. The Ethernet jack 135 comprises an 8-position 8-contact (8P8C) jack wired to comply with RJ-45 Ethernet standards.

The FRWD 100 includes an AC plug 150 on one side of the housing 110 so that the FRWD can be plugged into an AC socket (not shown) such as an AC socket built into a wall. In one embodiment, the AC plug 150 complies with the National Electrical Manufacturers Association (NEMA) standard for a 5-15 (Type B) 3-prong AC plug.

Figure 2:
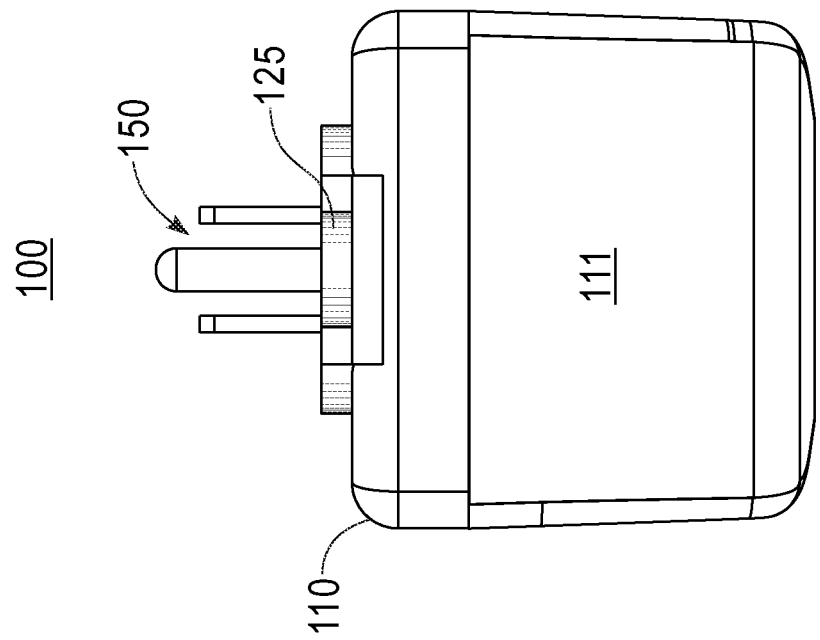
FIG. 2 is a top side view of one embodiment of the housing.

FIG. 2 is a top side view of the housing 110.

Figure 3:
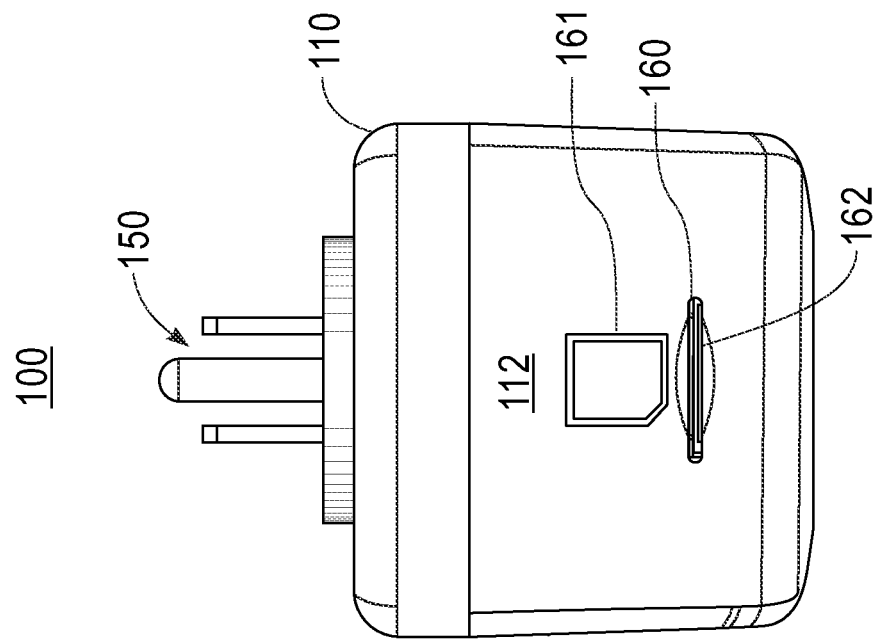
FIG. 3 is a bottom side view of one embodiment of the housing.

FIG. 3 is a bottom side view of the housing 110. The bottom view includes an slot 160 for insertion of a SIM card (not shown) into a SIM card reader 162, and a representation 161 of a SIM card to show, to a user, a proper orientation of a micro SIM card for insertion into the slot.

Figure 4:
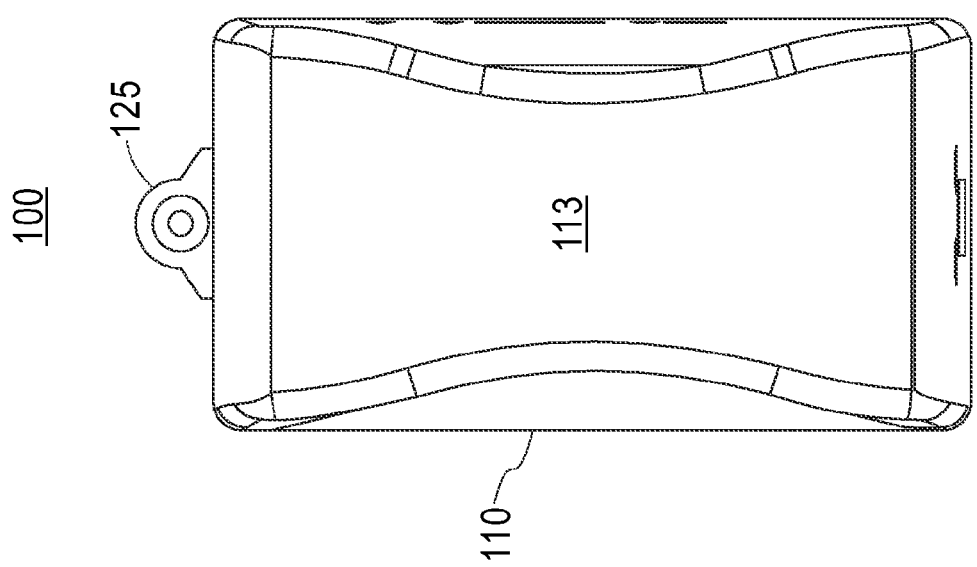
FIG. 4 is a front side view of one embodiment of the housing.

FIG. 4 is a front side view of the housing 110.

Figure 5:
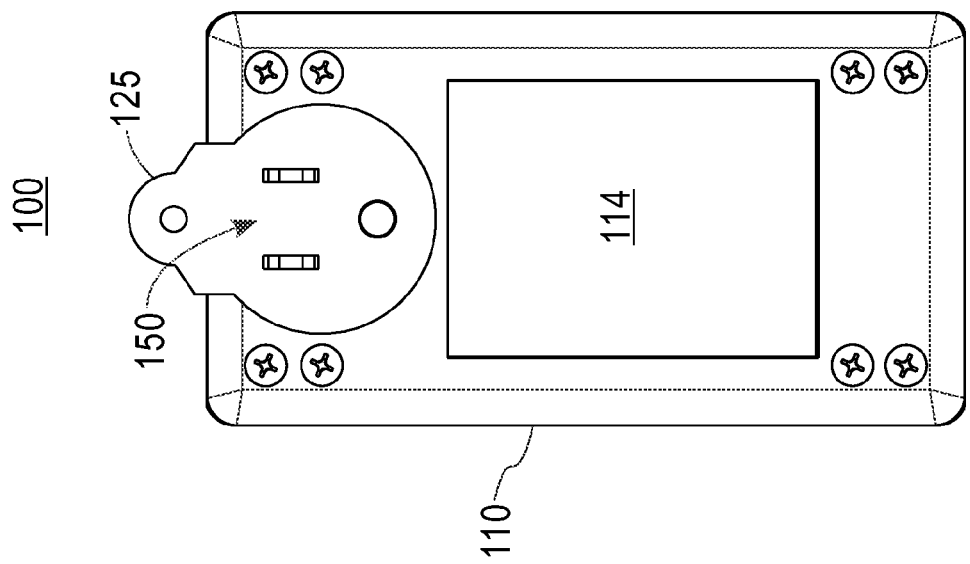
FIG. 5 is a back side view of one embodiment of the housing.

FIG. 5 is a back side view of the housing 110.

FIG. 6 is a left side view of the housing 110.

FIG. 7 is a right side view of the housing 110.

The housing 110 of the FRWD 100 has a form factor and size to allow for efficient size and placement of antennas within the housing 110 to accomplish diversity reception of a cellular signal, which is important given the higher data rate and modulation scheme used in $3^{rd}$ and $4^{th}$ generation cellular systems. The diversity reception of cellular signals by the FRWD 100 improves download and upload speeds of Internet data. In addition, a multiple-input and multiple-output (MIMO) antenna scheme improves the communications performance of the various wireless technologies including, but not limited to, WiFi and wireless local area network (WLAN).

The FRWD 100 includes an operating system (OS), WiFi software, Ethernet software, cellular software, Bluetooth software, and user interface software (collectively also referred to as "simpliFi software"). The simpliFi software provides a software interface between low-level drivers and the OS.

The FRWD 100 is capable of providing full-time usage without an external AC adapter. The FRWD 100 is deployed when it is plugged into an AC outlet. A location of deployment of the FRWD 100 can be changed to improve signal strength or for any other reason.

The FRWD 100 provides LAN Ethernet connectivity with IP-based devices. The FRWD 100 also provides WiFi connectivity with IP-based devices. The FRWD 100 provides, to IP-based devices that are in communication with the FRWD, Internet connectivity via a cellular system. The FRWD 100 provides such Internet connectivity without a need for the FRWD to be connected to the Internet via a wired connection.

Figure 8:
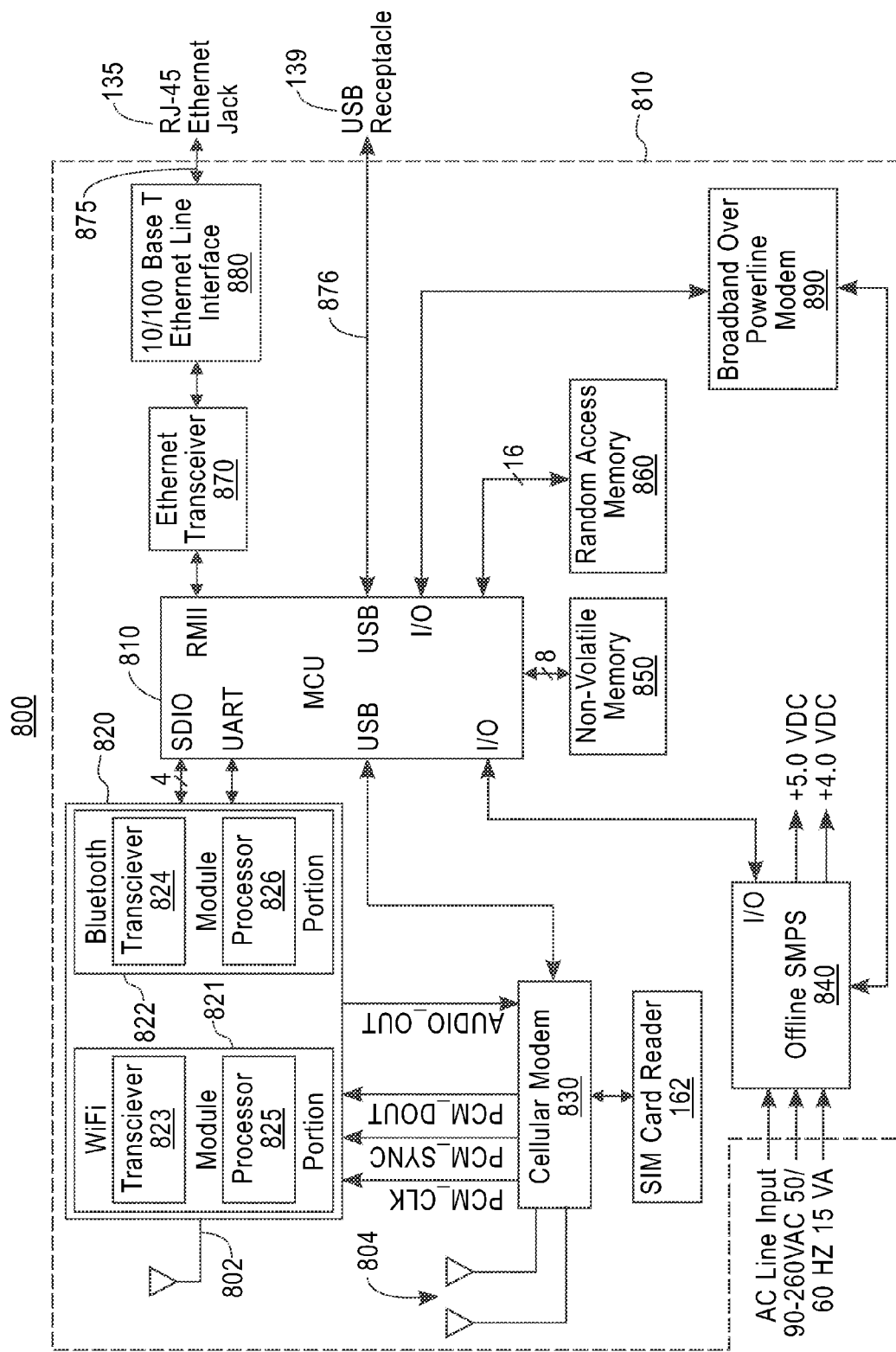
FIG. 8 is a functional block diagram of one embodiment of the circuitry of the fixed relocatable wireless device.

FIG. 8 is a functional block diagram of one embodiment of the circuitry 800 of the FRWD 100. The circuitry 800 of the FRWD 100 includes a microcontroller unit (MCU) 810. The circuitry 800 also includes a WiFi/Bluetooth module 820 that comprises a WiFi module portion 821 and a Bluetooth module portion 822. In one embodiment, the WiFi/Bluetooth module 820 is a wireless module sold by Murata Manufacturing Co., Ltd., of Kyoto, Japan. The WiFi module portion 821 comprises a WiFi transceiver 823 and WiFi software. The WiFi module portion 821 provides wireless connectivity to the Internet for one or more WiFi-compatible external devices. In one embodiment, the WiFi transceiver 823 is based upon the IEEE 802.11a/b/g/n standards. In another embodiment, the WiFi transceiver 823 also includes the IEEE 802.11ac standard. Upon initialization of the MCU 810, a firmware image is loaded into the WiFi transceiver 823. The firmware image provides initialization of the WiFi module portion 821 and provides a software interface between the WiFi transceiver 823 and the MCU 810. A hardware interface between the MCU 810 and the WiFi transceiver 823 comprises a secure digital input output (SDIO) port using four data bits. The SDIO is a four bit wide interface is used for serial data communication between the MCU 810 and the WiFi module portion 821. The SDIO interface allows the MCU 810 to control the WiFi module portion 821, and the SDIO interface provides a pathway for IP packets between the MCU and the WiFi module.

The simpliFi software provides an interface to an internal media access control (MAC) interface of the MCU 810. The software interface includes a transmission control protocol (TCP) interface, a WiFi supplicant, a point-to-point protocol (PPP) server, as well as providing a dynamic host configuration protocol (DHCP), network address translation (NAT), and domain name services (DNS) resolution. The WiFi transceiver 823 is coupled to the antenna 802. In one embodiment, the antenna 802 is a dual-band (2.4 GHz and 5 GHz) antenna. In another embodiment, the WiFi transceiver 823 is coupled to a first single-band (2.4 GHz) antenna and to a second single-band (5 GHz) antenna. In yet another embodiment, the WiFi transceiver 823 is coupled to only the first single-band (2.4 GHz) antenna.

The circuitry 800 of the FRWD 100 includes a cellular modem 830. In one embodiment, the cellular modem 830 is a Cinterion model PHS8 wireless module manufactured by Cinterion Wireless Modules GmbH of Munich, Germany.

Another hardware interface includes a pulse-code modulation (PCM) audio interface to allow voice calls to be made via a Bluetooth interface. A PCM audio interface of the WiFi/Bluetooth module 820 in conjunction with a PCM audio interface of the cellular modem 830 provides a low noise, distortion free, audio path. Signals sent from the cellular modem 830 to the WiFi/Bluetooth module 820 include a PCM_CLK signal, a PCM_SYNC signal and a PCM_DOUT signal. Signals sent from the WiFi/Bluetooth module 820 to the cellular modem 830 include an AUDIO_OUT signal. In other words, using a Bluetooth-enabled cordless phone, or telephone handset, a voice call can be made over a cellular network through the cellular modem 830. Advantageously, the usual analog audio interface circuitry (not shown) between a Bluetooth transceiver and a cellular modem is advantageously eliminated.

Switched-Mode Power Supply

The circuitry 800 of the FRWD 100 includes an off-line switched-mode power supply (SMPS) section 840. Overall device power for the FRWD 100 is supplied by the off-line SMPS section 840. The off-line SMPS section 840 takes input from a conventional AC source in the range of 90-260 VAC and produces several direct current (DC) voltages that are fed to various subsections of the FRWD 100. For simplicity of illustration, the lines supplying the DC voltages from the off-line SMPS section 840 to the various subsections of the FRWD 100 are not shown in FIG. 8. The offline SMPS section 840 is controlled by the MCU 810 via an I/O line.

Microcontroller

In one embodiment, the MCU 810 is a microprocessor from the ARM family of microprocessors manufactured by ARM Holdings plc of Cambridge, United Kingdom. The MCU 810 includes a processor that executes firmware (image) contained in a non-volatile memory 850 such as flash memory, after being boot-loaded into a random access memory (RAM) 860. The firmware may be in the form of an OS. In one embodiment, the OS is LINUX®. The OS, when combined with the simpliFi software, creates the functionality of the circuitry 800 of the FRWD 100. The functionality can provide various connectivity options for external devices including but limited to a) WiFi-based devices, i.e., iPads®, laptops, computers, picture frames, appliances, security systems, game consoles, TVs, etc., b) Bluetooth®-based devices, i.e., medical devices, telephony devices, general purpose devices, fitness devices, picture frames, audio devices, etc., c) USB-based devices, i.e., security cameras, hubs, picture frames, audio devices, etc., and d) Ethernet-based LAN devices. Ethernet-based LAN devices include point of sale (POS) terminals, switches, voice over Internet protocol (VoIP) private branch exchanges (PBXs), computers, networks, routers, cameras, automated teller machines (ATMs), security systems, televisions, an Internet protocol television (IPTV) appliances, digital video recorders (DVRs), other Internet appliances, etc.

Figure 9:
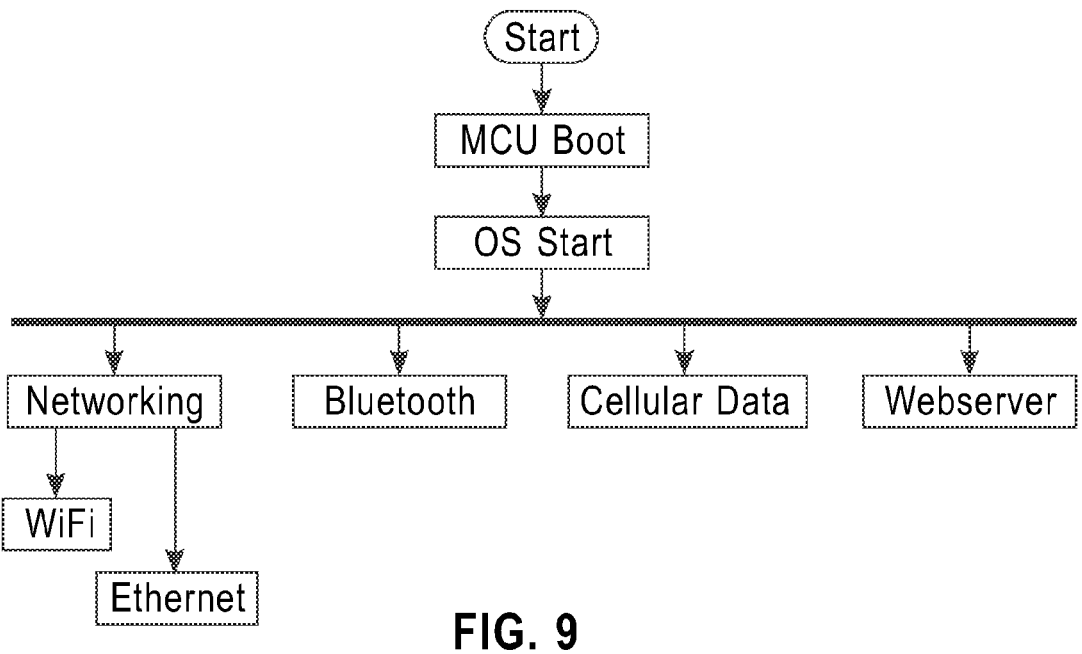
FIG. 9 is a functional flow diagram at power up of the fixed relocatable wireless device.

FIG. 9 is a functional flow diagram at power up of the FRWD 100. At power up of the MCU 810, the boot loader program is started which initializes the RAM 860, the non-volatile memory 850, and other critical peripherals. A boot loader program locates, loads, and executes the OS. The OS then initializes additional peripherals and starts several software services including Bluetooth software, WiFi software, cellular software, Ethernet software and USB software. The OS provides routing, filtering, blocking (firewall), network address translation (NAT), dynamic host configuration protocol (DHCP), domain name services (DNS) resolution and bridging of IP traffic, without complicated remote device setup.

The boot loader program is stored in an internal boot ROM of the MCU 810. The boot ROM contains software to configure the non-volatile memory 850, to read code from the non-volatile memory, and to load such code into an internal RAM of the MCU 810. Then, the MCU 810 executes such code.

The code that the boot loader program loads into the internal RAM from the internal boot ROM is called a first stage bootloader (FSB). The FSB is necessary because the boot loader program can only load as much code as will fit into the internal RAM of the MCU 810. Because the size of the internal RAM is so small, the external RAM 860 is configured by the FSB. The FSB configures the external RAM 860, then copies the OS from the non-volatile memory 850 into the RAM 860, and begins executing the OS. After the OS begins executing, the FSB stops running.

As the OS boots, it loads some drivers immediately to configure necessary hardware peripherals, such as flash memory which contain applications that the OS is to run. Other peripherals, such as the cellular modem 830 and the WiFi/Bluetooth module 820, are configured later. Once the necessary hardware peripherals are configured, the OS executes a single initialization program. This program, called "init", is responsible for loading and running additional programs. The init program is similar to the FSB; however, unlike the FSB, the init program continues to run while the FRWD 100 is powered, and the init program stops only when the FRWD is turned off.

The init program finds and runs small applications known as "init scripts". The init scripts execute the remaining applications. At bootup, one of the init scripts starts the following software components: a Bluetooth stack, a WiFi stack, a cellular data stack, and a webserver.

Bluetooth

The Bluetooth module portion 822 comprises a Bluetooth transceiver 824, a peripheral processor 826 and Bluetooth software. The Bluetooth transceiver 824 provides wireless connectivity between the FRWD 100 and an external Bluetooth-enable device. In one embodiment, the Bluetooth transceiver 824 provides wireless digital voice connectivity between the FRWD 100 and a Bluetooth-enable handset or cordless telephone.

The Bluetooth software initializes the Bluetooth module portion 822. The Bluetooth software handles authentication of devices requesting to pair and handles communication to devices with which the FRWD 100 is already paired. The Bluetooth software includes the Bluetooth stack.

Figure 10:
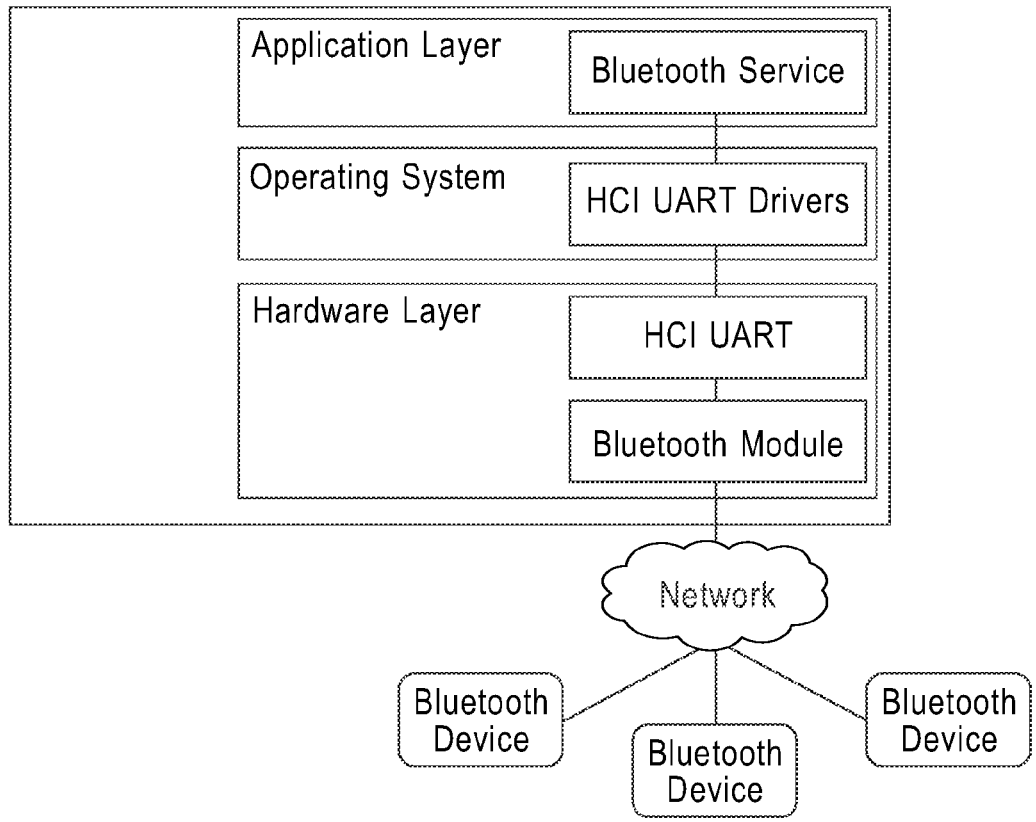
FIG. 10 is a representation of a Bluetooth stack of software of the fixed relocatable wireless device.

FIG. 10 is a representation of the Bluetooth stack. The Bluetooth stack comprises of several layers of kernel drivers, and a BlueZ Bluetooth protocol stack for LINUX with modifications to support a HFP-to-cellular bridge of the FRWD 100. The Bluetooth stack comprises drivers to control the Bluetooth module portion 822, and a Bluetooth daemon to manage Bluetooth connections (device pairings). The Bluetooth daemon is customized to allow paired handset devices to send and receive calls over a voice interface of the cellular modem 830.

The Bluetooth daemon supports several Bluetooth profiles. In one embodiment, a hands-free profile (HFP) is used, which allows pairing and communication with external handsets. The FRWD 100 allows a Bluetooth-enabled cordless phone or telephone handset (not shown) to communicate with the cellular modem 830, by sending/translating commands to the modem to send dual-tone multi-frequency (DTMF) signaling, and to connect and disconnect calls.

For example, when the cellular modem 830 receives a call, it first sends a command to the software of the FRWD 100, and the command is forwarded to the wireless telephone handset, which causes the wireless telephone handset to ring. When a user picks up, or otherwise answers the call, the wireless telephone handset sends a command down to the FRWD 100 to connect. The software of the FRWD 100 then forwards the command to the cellular modem 830. At that point, audio data begins transmitting to and from the wireless telephone handset, through the Bluetooth module portion 822, and directly to the cellular modem 830 through a dedicated audio data link between the Bluetooth module portion 822 and the cellular modem 830. This is separate from a command link that is routed through the MCU 810.

The Bluetooth transceiver 824 is based upon the IEEE 810.15.1 standard. Upon initialization of the MCU 810, a firmware image (including the Bluetooth stack) is loaded into the Bluetooth transceiver 824, which provides initialization of the Bluetooth transceiver 824 and provides a software interface between the Bluetooth transceiver and the MCU 810. Yet another hardware interface between the MCU 810 and the Bluetooth transceiver 824 comprises a host communications interface (HCI) via a universal asynchronous receiver/transmitter (UART) port on the MCU 810. The UART HCI interface provides a 1-bit wide serial data communication link between the MCU 810 and the Bluetooth module portion 822. The UART HCI interface allows the MCU 810 to control the Bluetooth module portion 822, and provides a pathway for IP packets between the MCU and the Bluetooth module portion. The Bluetooth peripheral processor 826 supports UART HCI baud rates up to 4 Mbps.

In addition to the Bluetooth stack, the FRWD 100 includes various Bluetooth profiles that provide an interface to specific external Bluetooth-enabled devices. In one embodiment, the FRWD 100 uses only the HFP Bluetooth profile for communication with a Bluetooth-enabled cordless phone or telephone handset. Other embodiments of the FRWD 100 use additional Bluetooth profiles including, but not limited to, an object push profile (OPP), a health device profile (HDP), a headset profile (HSP), a LAN access profile (LAP), etc. The Bluetooth transceiver 824 is coupled to the antenna 802.

The OS includes drivers that allow it to communicate with the Bluetooth transceiver 824. The Bluetooth transceiver 824 includes software that allows it to communicate with the MCU 810 so that the MCU can load additional software (firmware) onto the Bluetooth transceiver. Once this firmware is loaded, the Bluetooth transceiver 824 is fully operational. A Bluetooth application communicates with the Bluetooth stack to forward commands between a paired Bluetooth device and the cellular modem 830.

WiFi

The WiFi transceiver 823 includes another peripheral processor 825 (logically separate from the peripheral processor of the Bluetooth transceiver). In one embodiment, the Bluetooth transceiver 824 and the WiFi transceiver 823 are in a same integrated circuit package and share a physical peripheral processor. In another embodiment (not shown), the Bluetooth transceiver 824 and the WiFi transceiver 823 are in separate integrated circuit packages and each has its own physical peripheral processor. The WiFi transceiver 823 includes software that allows it to communicate with the MCU 810. The OS contains additional drivers that allow it to communicate with the WiFi transceiver 823. As with the Bluetooth transceiver 824, the WiFi transceiver 823 needs its own firmware, i.e., WiFi software, loaded onto it by the MCU 810 before the WiFi transceiver becomes fully operational. The WiFi software initializes the WiFi transceiver 823, and handles authentication of a client attempting to connect to the FRWD 100 via WiFi. Once authenticated, the OS handles transfer of data from the WiFi software to the Ethernet software or to the cellular software. The WiFi software includes a WiFi stack.

Figure 11:
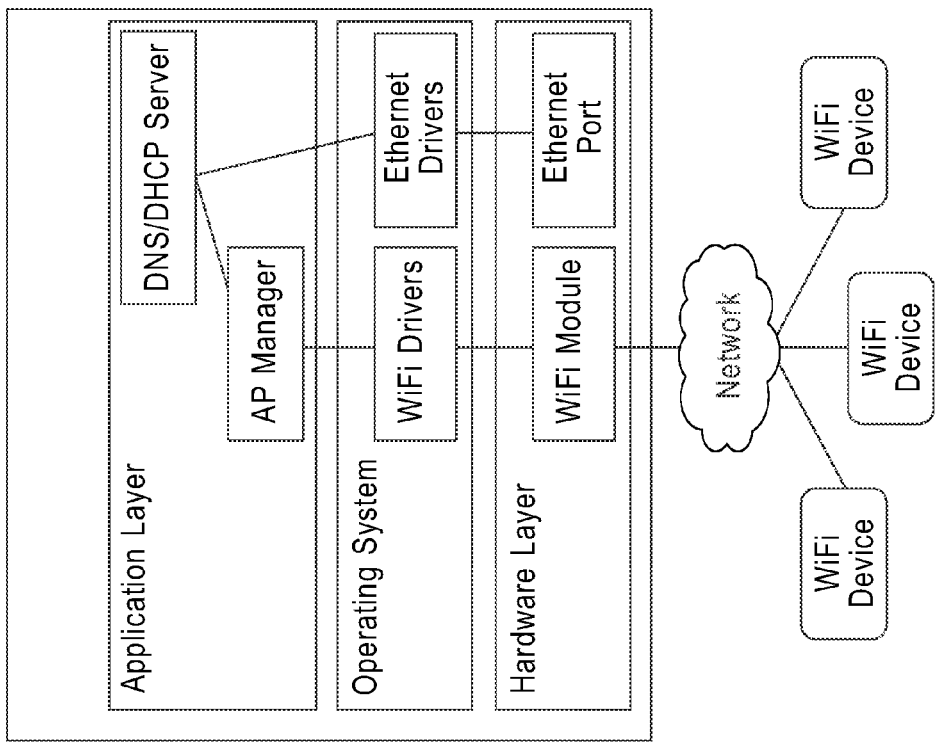
FIG. 11 is a representation of a WiFi stack of the software of the fixed relocatable wireless device.

FIG. 11 is a representation of the WiFi stack. A WiFi application communicates with the WiFi stack to forward commands between a paired WiFi device and the cellular modem 830. The WiFi stack is started by an init script. The init script loads the necessary drivers to communicate with the WiFi side of the WiFi/Bluetooth module. In another embodiment, Bluetooth and WiFi are handled by separate modules. An advantage to having Bluetooth and WiFi in a same module is that the module can then automatically manage "switching" one or the other on and off as necessary because Bluetooth and WiFi share a same frequency spectrum (2.4 GHz band). The handling of Bluetooth and WiFi by a same module helps eliminate interference between the two. In one embodiment, the WiFi transceiver 823 and the Bluetooth transceiver 824 use a same antenna. In another embodiment the WiFi transceiver 823 and the Bluetooth transceiver 824 use separate antennas.

In addition to the drivers that control WiFi transceiver 823, additional applications are loaded that allow the FRWD 100 to serve as an access point (AP), or WiFi hotspot. The WiFi transceiver 824 can operate as a client or as a host device, or it can operate as a hotspot, or as a WiFi network device. In one embodiment, the FRWD 100 operates as a client for a short period of time, so that it can gather information about other hotspots in the area, in particular, the frequencies (channels) and strength of the signals of each, so that the FRWD can choose a hotspot configuration that is least likely to conflict with nearby networks. After about ten seconds of scanning nearby networks, the FRWD 100 is converted to AP host mode. At that point, client devices can then connect to the FRWD 100 via WiFi. The above embodiment scans for a least-congested channel. In another embodiment, the FRWD 100 scans in the AP mode. Another embodiment includes security features supported by the WiFi module portion 821, i.e., Wi-Fi-protected access (WPA and WPA2.0) and the IEEE 802.11i standard including the hardware-accelerated Advanced Encryption Standard (AES).

An application manages the AP in general and in particular manages associations, i.e., connections, with other clients including handling authentication, i.e., ensuring the client has the right password to access the WiFi network. The application manager also manages addresses for clients over an Ethernet port 875.

Additional software in the WiFi stack handles assigning IP addresses to clients when they connect over WiFi or over Ethernet. Each client receives a unique IP address from the FRWD 100.

Ethernet

The circuitry 800 of the FRWD 100 comprises an Ethernet port 875. The Ethernet port 875 includes an Ethernet transceiver 870 coupled to a reduced media independent interface (RMII) of the MCU 810 for control and data transport compliant to IEEE 810.3-2005 standards. The Ethernet transceiver 870 includes a 10BASE-T/100BASE-TX physical layer. The physical layer converts electrical signals to digital signals, and vice versa. In one embodiment, the Ethernet transceiver 870 is an Ethernet transceiver manufactured by Microchip Technology Inc., of Chandler, Ariz. An isolation transformer 880 is used to interface the Ethernet transceiver 870 with the RJ-45 Ethernet jack 135. In one embodiment, the isolation transformer 880 is a Palnova magnetic module manufactured by Palpilot International Corporation, Ltd., of Tustin, Calif. The Ethernet software handles transfer of data through the Ethernet port 875.

USB

The MCU 810 includes a USB version 2.0 or a USB 3.0 controller capable of operating as either a USB device or a USB host. As a host controller, the MCU 810 can enumerate and control a USB device coupled to it. The USB controller in the MCU 810 supports eight endpoints: one control, one bulk-out, one bulk-in, and five flexible endpoints. Using on the go (OTG) features, the USB controller can negotiate with another OTG USB controller of another system to become either the host or the device in a peer connection. The USB controller operates either in full-speed mode or high-speed mode. The USB controller is coupled to a USB port 876 of the FRWD 100. The USB port 876 includes the USB receptacle 139. In one embodiment, the USB receptacle 139 is a USB standard-A receptacle.

The USB software handles transfer of information when an external USB device is coupled to the USB port 876. Firmware updates for the MCU 810 can be loaded into the non-volatile memory 850 from a standard jump drive using the USB port 876. The USB port 876 can also be used to perform a full or partial OS update and/or to install custom applications that can run under the OS of the FRWD 100. In addition, the USB port 876 can accept a conventional jump drive on which is stored a file, and then the FRWD 100 can be used to transfer the file from the jump drive to another device using a WiFi connection between the FRWD and the other device.

Cellular Modem

The cellular modem 830 includes a cellular transceiver that transmits and receives data on a cellular network via data packets, and cellular software. The cellular modem 830 is coupled to the MCU 810 by a USB bus. The MCU 810 controls operation of the cellular modem 830 through this USB bus. The USB bus provides a pathway for IP packets between the MCU 810 and the cellular modem 830. Separate USB devices are enumerated through this USB bus. For example, an "Interface 2" (application port) is used to send AT commands to the cellular modem 830, and an "Interface 3" (modem port) is used to pass IP packets to and from a cellular network.

The cellular transceiver is coupled to the antenna 804. In one embodiment, the antenna 804 is a cellular diversity antenna.

The cellular modem 830 provides both data and voice connectivity for the FRWD 100 through a cellular network. A PPP connection via the cellular modem 830 provides the back-haul connection to the Internet for all data related operations of the FRWD 100, i.e., surfing the Internet via WiFi or via the Ethernet port 875. The cellular modem 830 also supports various other data connections, i.e., user datagram protocol (UDP), TCP/IP, etc. The cellular modem 830 is a class-A device, which allows simultaneous data and voice connections to a cellular network. This allows the FRWD 100 to provide Internet connectivity for web browsing while a voice call is in progress. The cellular modem 830 supports all known global cellular network standards.

The cellular modem 830 contains two primary and independent interfaces: a voice interface for making/receiving voice calls and a data interface that provides internet access over a cellular network. The Bluetooth stack manages the voice interface of the cellular modem 830. A PPP daemon manages the data interface of the cellular modem 830. The cellular software includes a cellular data stack.

Figure 12:
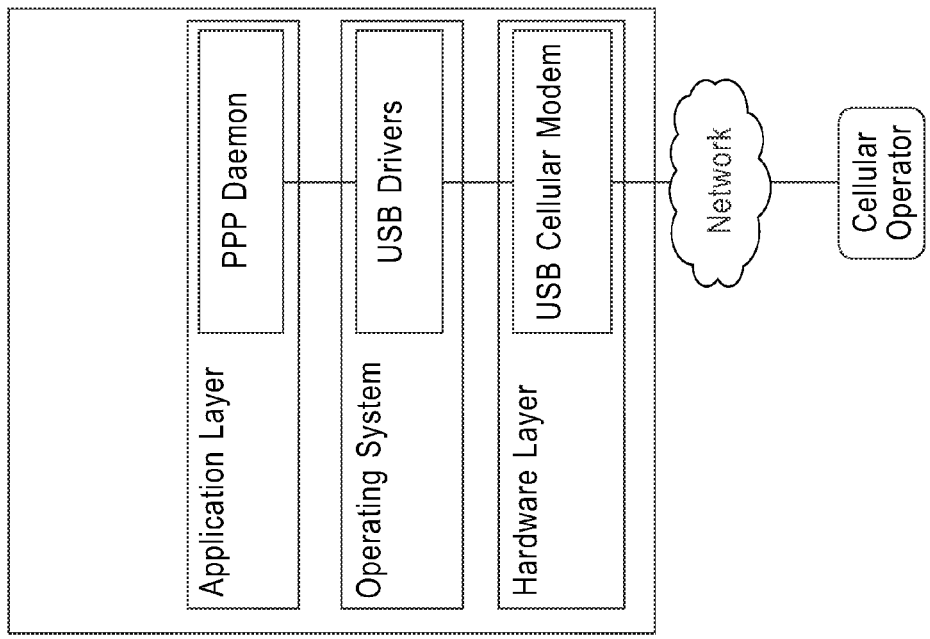
FIG. 12 is a representation of a cellular data stack of the software of the fixed relocatable wireless device.

FIG. 12 is a representation of a cellular data stack. The cellular data stack includes an AT command set. Another init script starts the cellular data stack. The cellular software initializes the cellular modem 830 and authenticates itself on the cellular network using, in one embodiment, a plug-in subscriber identity module (SIM) card, as well as software parameters. Once authenticated, the cellular software handles the transfer of network data packets, which may include Internet data or a cellular voice call.

Figure 13:
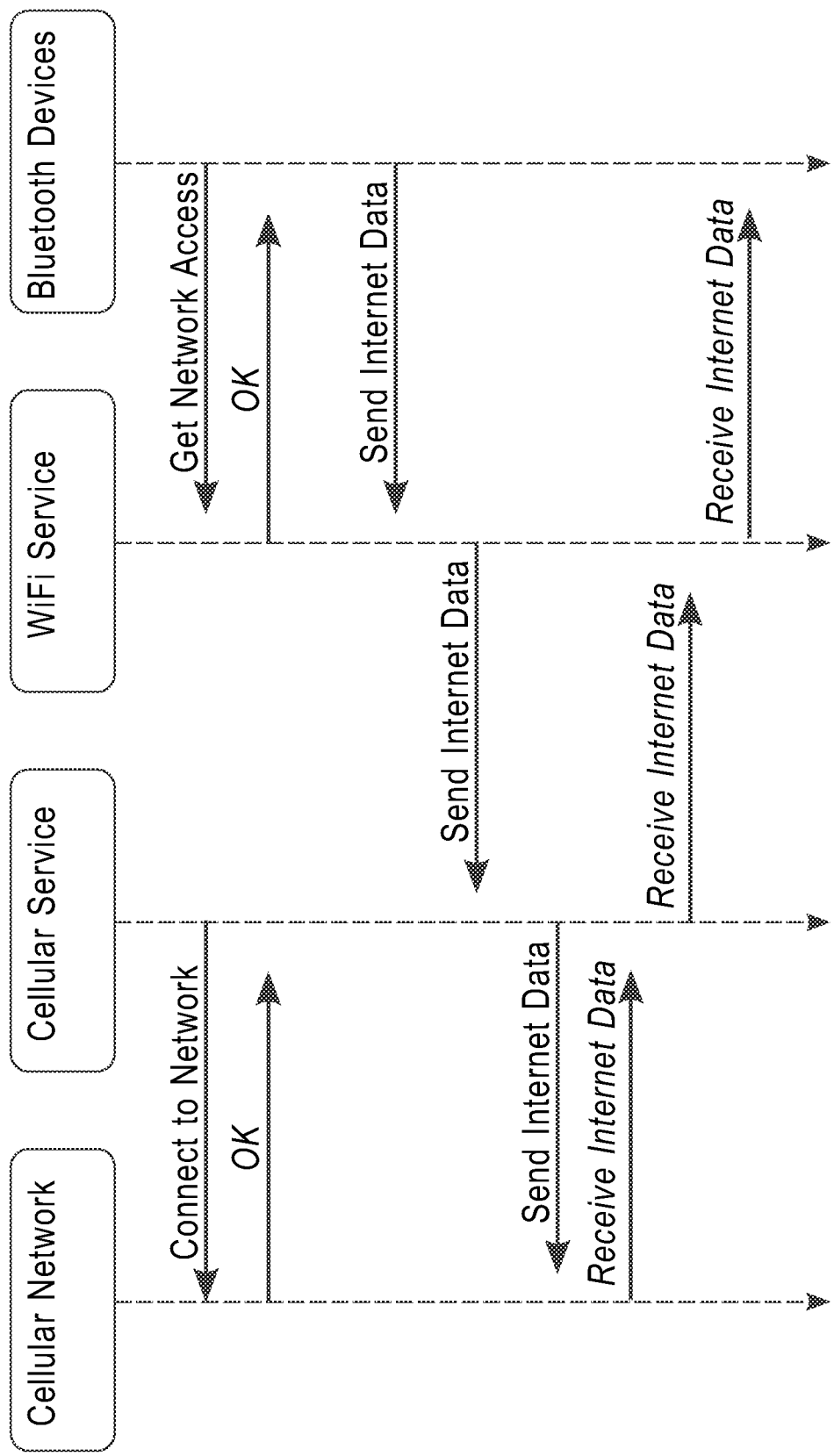
FIG. 13 is a signal flow diagram indicating operation of the fixed relocatable wireless device.

FIG. 13 is a signal flow diagram indicating operation of the FRWD 100.

In one embodiment, the FRWD 100 includes a broadband over powerline (PBL) modem 890. The BPL modem 890 is coupled to the microcontroller 810 which controls operation of the BPL modem. The BPL modem 890 is coupled to the off-line SMPS section 840 through which the BPL modem transmits and receivers IP packets over an AC powerline. The BPL modem 890 re-transmits, on an AC powerline, data packets received by the FRWD 100 from one or more of: an external WiFi device, an external Bluetooth device, an external Ethernet device, and a cellular system. The BPL modem 890 also receives, on an AC powerline, data packets for re-transmittal by the FRWD 100 on one or more of: an external WiFi device, an external Bluetooth device, an external Ethernet device, and a cellular system. Additionally, the BPL modem can transmit and receive data packets from ancillary BPL-enabled devices using AC powerlines as defined by "Home Plug" as an example.

User Interface

Advantageously, generally a user has no direct interaction with the simpliFi software. Once configured by a user interface, the FRWD allows an external local device access to the Internet without drivers or additional software in the local device, and without an external computer. A user merely connects via either WiFi or Ethernet, and then the user can browse the Internet, and/or the user can pair a Bluetooth handset with the FRWD 100, and, subsequently, the user can make and receive voice calls from the Bluetooth handset.

For initial setup, a user configures some settings of the simpliFi software through the user interface. The user interface is handled by a web interface which a user can access by opening a web browser on a personal computer that is in communication via Ethernet, Ethernet over powerline, WiFi or Bluetooth with the FRWD 100, and by entering a special simpliFi Internet address in the web browser. The special simpliFi Internet address connects the web browser to the FRWD 100 only, and not to the Internet. When FRWD 100 is shipped from the factory, the FRWD is specially configured such that, when a user opens their web browser, the FRWD will redirect the user to an internal configuration page of the simpliFi software upon any attempt by the user to visit any website through the FRWD. This compels the user to perform an initial configuration. After the initial configuration is complete, the redirection is turned off. After the initial configuration is complete, if a user wishes to change settings and/or configuration of the FRWD 100, the user is required to enter the special simpliFi Internet address to access the configuration page.

The web interface is handled by running a web server within the FRWD 100. The web server listens for requests from clients for a page, and responds with the data of that page. In the case of the FRWD 100, the web server has one website: a simpliFi configuration website and it is intended to be accessed, generally, by only the user of the FRWD. When the user accesses the simpliFi configuration website—either by force, due to redirection, or by entering the special internet address after configuration—the user must first login.

Figure 14:
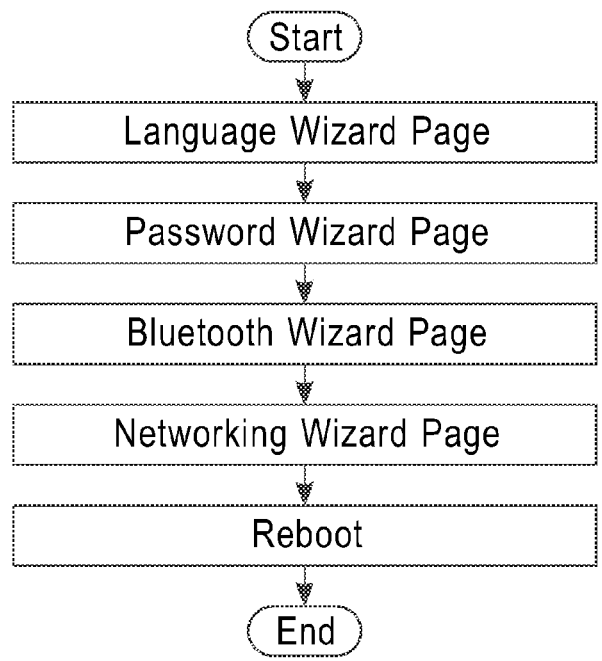
FIG. 14 is a functional flow diagram of a language wizard of a user interface for the fixed relocatable wireless device.

FIG. 14 is a functional flow diagram of a language wizard of the user interface. After a user logs in, the user is presented with an initial setup wizard page if the FRWD 100 has not already been configured. The setup wizard page allows a user to step through the configuration of the FRWD 100, which is broken down into several smaller pages. Once a user has stepped through all the configuration steps, the redirection is turned off, and the FRWD 100 reboots. After the FRWD 100 reboots, a user can access the Internet transparently.

If the FRWD 100 has been previously configured, then, when a user logs in, the user is presented with a menu of configuration options on the user's personal computer, and an ability to change the configuration.

Figure 15:
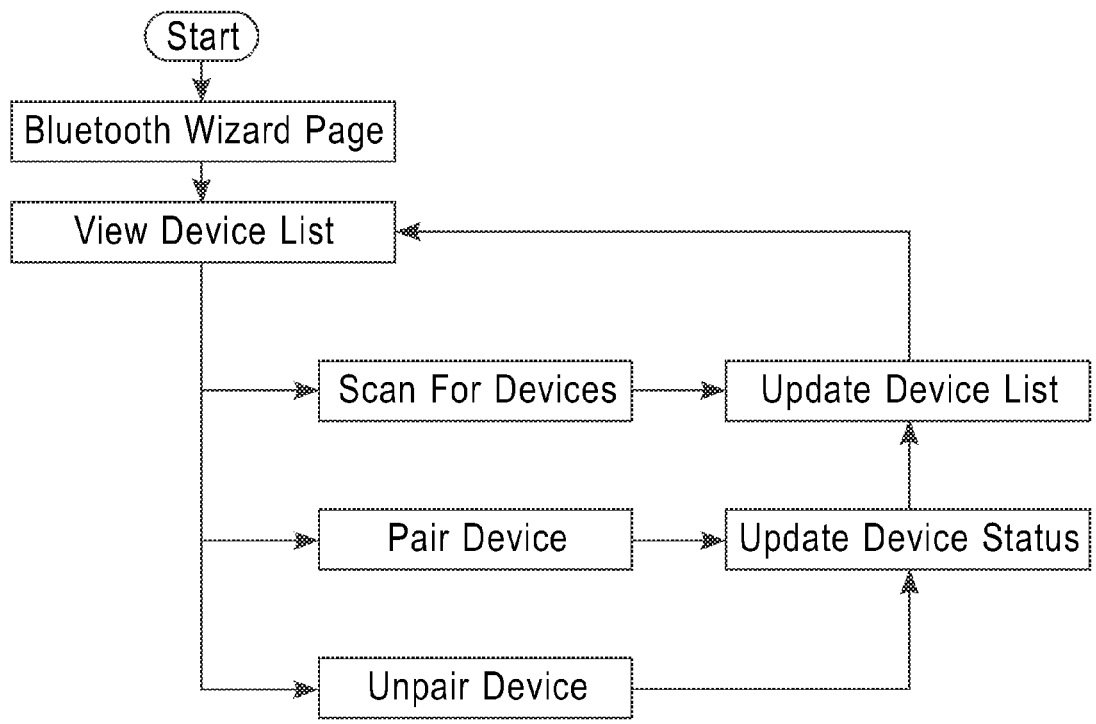
FIG. 15 is a functional flow diagram of a Bluetooth wizard of the user interface.

FIG. 15 is a functional flow diagram of a Bluetooth wizard of the user interface. The simpliFi software allows a user to pair Bluetooth devices via a web browser, or web interface. Once a user is logged in, the user can select "Bluetooth Devices" from a menu, scan for new devices or connect/disconnect from the list of devices found in the area.

The simpliFi software also allows a user to configure cellular parameters via a web browser, or web interface. The web interface allows certain, privileged users to modify cellular related parameters of the FRWD 100.

The FRWD 100 can transfer IP packets among WiFi devices that are in communication with the FRWD, without the FRWD being in communication with the Internet and without the FRWD being in communication with a cellular system.

The FRWD 100 can transfer IP packets among Ethernet devices that are in communication with the FRWD, without the FRWD being in communication with the Internet and without the FRWD being in communication with a cellular system.

The FRWD 100 can transfer IP packets between a WiFi device that is in communication with the FRWD and an Ethernet device that is in communication with the FRWD, without the FRWD being in communication with the Internet and without the FRWD being in communication with a cellular system.

The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. Moreover, the terms "front", "back", "top", "bottom", "over", "under", and the like, in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims.

The Detailed Description section, and not the Abstract section, is intended to be used to interpret the claims. The Abstract section may set forth one or more but not all embodiments of the invention, and the Abstract section is not intended to limit the invention or the claims in any way.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

Note that the term "couple" has been used to denote that one or more additional elements may be interposed between two elements that are coupled. The term "coupled", as used herein, is defined as "connected", and encompasses the coupling of devices that may be physically, electrically or communicatively connected (according to context), although the coupling may not necessarily be directly, and not necessarily be mechanically. The term "coupled", as used herein, is not intended to be limited to a direct coupling or a mechanical coupling, and that one or more additional elements may be interposed between two elements that are coupled.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A fixed relocatable wireless device, comprising:
a housing shaped as an AC wall adapter; and
circuitry within the housing, the circuitry including:
a microcontroller for controlling transmission of data packets through the fixed relocatable wireless device,
a cellular transceiver, coupled to the microcontroller, for wirelessly transmitting and receiving data packets on a cellular network,
an Ethernet port, coupled to the microcontroller, for receiving signals via wire from, and transmitting signals via wire to, an external Ethernet device that is external to the fixed relocatable wireless device, wherein the cellular transceiver re-transmits, on the cellular network, data packets received by the Ethernet port from the external Ethernet device, and
a WiFi transceiver, coupled to the microcontroller, for receiving wireless signals from, and transmitting wireless signals to, an external WiFi device that is external to the fixed relocatable wireless device,
wherein the fixed relocatable wireless device transfers IP packets between an external WiFi device that is in communication with the fixed relocatable wireless device and an external Ethernet device that is coupled to the Ethernet port, without the fixed relocatable wireless device being in communication with the cellular network.

2. The fixed relocatable wireless device according to claim 1, wherein the AC wall adapter includes an AC plug on a first side of the AC wall adapter and an Ethernet jack on one or more sides of the AC wall adapter other than the first side.

3. The fixed relocatable wireless device of claim 2, including a switched-mode power supply section for supplying DC power to components of the fixed relocatable wireless device, and wherein the AC plug is coupled to the switched-mode power supply section.

4. The fixed relocatable wireless device of claim 1, wherein the cellular transceiver re-transmits, on the cellular network, data packets received by the WiFi transceiver from the external WiFi device.

5. The fixed relocatable wireless device of claim 4, including a Bluetooth transceiver, coupled to the microcontroller, for receiving wireless signals from, and transmitting wireless signals to, an external Bluetooth device that is external to the fixed relocatable wireless device, wherein the cellular transceiver re-transmits, on the cellular network, data packets received by the Bluetooth transceiver from the external Bluetooth device.

6. The fixed relocatable wireless device of claim 1, including a Bluetooth transceiver, coupled to the microcontroller, for receiving wireless signals from, and transmitting wireless signals to, an external Bluetooth device that is external to the fixed relocatable wireless device, wherein the cellular transceiver re-transmits, on the cellular network, data packets received by the Bluetooth transceiver from the external Bluetooth device.

7. The fixed relocatable wireless device of claim 6, wherein the cellular transceiver re-transmits, on the cellular network, data packets received by the WiFi transceiver from the external WiFi device.

8. A fixed relocatable wireless device enclosed in a housing, the fixed relocatable wireless device comprising:
a microcontroller for controlling transmission of data packets through the fixed relocatable wireless device;

a cellular transceiver, coupled to the microcontroller, for wirelessly transmitting and receiving data packets on a cellular network;

a WiFi transceiver, coupled to the microcontroller, for receiving wireless signals from, and transmitting wireless signals to, an external WiFi device that is external to the fixed relocatable wireless device, wherein the cellular transceiver re-transmits, on the cellular network, data packets received by the WiFi transceiver from the external WiFi device, wherein the housing has a shape of an AC wall adapter, and wherein, upon power up of the fixed relocatable wireless device, the fixed relocatable wireless device operates as a WiFi client, and, after fixed relocatable wireless device gathers information about other hotspots in the area of the fixed relocatable wireless device, the fixed relocatable wireless device operates as a WiFi access point.

9. The fixed relocatable wireless device of claim 8, including a switched-mode power supply section for supplying DC power to components of the fixed relocatable wireless device, wherein the AC wall adapter includes an AC plug, and wherein the AC plug is coupled to the switched-mode power supply section.

10. The fixed relocatable wireless device of claim 8, including a Bluetooth transceiver, coupled to the microcontroller, for receiving wireless signals from, and transmitting wireless signals to, an external Bluetooth device that is external to the fixed relocatable wireless device, wherein the cellular transceiver re-transmits, on the cellular network, data packets received by the Bluetooth transceiver from the external Bluetooth device.

11. The fixed relocatable wireless device of claim 10, including an Ethernet port, coupled to the microcontroller, for receiving signals via wire from, and transmitting signals via wire to, an external Ethernet device that is external to the fixed relocatable wireless device, wherein the cellular transceiver re-transmits, on the cellular network, data packets received by the Ethernet port from the external Ethernet device.

12. The fixed relocatable wireless device of claim 8, including an Ethernet port, coupled to the microcontroller, for receiving signals via wire from, and transmitting signals via wire to, an external Ethernet device that is external to the fixed relocatable wireless device, wherein the cellular transceiver re-transmits, on the cellular network, data packets received by the Ethernet port from the external Ethernet device.

13. The fixed relocatable wireless device of claim 12, including a Bluetooth transceiver, coupled to the microcontroller, for receiving wireless signals from, and transmitting wireless signals to, an external Bluetooth device that is external to the fixed relocatable wireless device, wherein the cellular transceiver re-transmits, on the cellular network, data packets received by the Bluetooth transceiver from the external Bluetooth device.

14. A fixed relocatable wireless device enclosed in a housing, the fixed relocatable wireless device comprising:
 a microcontroller for controlling transmission of data packets through the fixed relocatable wireless device;

a cellular transceiver, coupled to the microcontroller, for wirelessly transmitting and receiving data packets on a cellular network;

a Bluetooth transceiver, coupled to the microcontroller, for receiving wireless signals from, and transmitting wireless signals to, an external Bluetooth device that is external to the fixed relocatable wireless device, wherein the cellular transceiver re-transmits, on the cellular network, data packets received by the Bluetooth transceiver from the external Bluetooth device; and a pulse-code modulation audio interface, coupled between the cellular transceiver and the Bluetooth transceiver, to allow voice calls to be made on a cellular network via an external Bluetooth device, wherein the housing is shaped as an AC wall adapter.

15. The fixed relocatable wireless device of claim 14, including a WiFi transceiver, coupled to the microcontroller, for receiving wireless signals from, and transmitting wireless signals to, an external WiFi device that is external to the fixed relocatable wireless device, wherein the cellular transceiver re-transmits, on the cellular network, data packets received by the WiFi transceiver from the external WiFi device.

16. The fixed relocatable wireless device of claim 14, including an Ethernet transceiver, coupled to the microcontroller, for receiving signals via wire from, and transmitting signals via wire to, an external Ethernet device that is external to the fixed relocatable wireless device, wherein the cellular transceiver re-transmits, on the cellular network, data packets received by the Ethernet transceiver from the external Ethernet device.

17. The fixed relocatable wireless device of claim 16, wherein the AC wall adapter includes an AC plug on a first side, and includes, on one or more sides other than the first side, an Ethernet jack.

18. The fixed relocatable wireless device of claim 17, including a switched-mode power supply section for supplying DC power to components of the fixed relocatable wireless device, and wherein the AC plug is coupled to the switched-mode power supply section.

19. The fixed relocatable wireless device of claim 18, including a broadband over powerline modem, coupled to the microcontroller and to the switched-mode power supply section, wherein the broadband over powerline modem re-transmits, on an AC powerline to which the fixed relocatable wireless device is coupled, the data packets received by the fixed relocatable wireless device from one or more of: an external WiFi device, an external Bluetooth device, an external Ethernet device, and a cellular system.

20. The fixed relocatable wireless device of claim 19, wherein the broadband over powerline modem receives, on an AC powerline to which the fixed relocatable wireless device is coupled, data packets for re-transmittal by the fixed relocatable wireless device on one or more of: an external WiFi device, an external Bluetooth device, an external Ethernet device, and a cellular system.

* * * * *